United States Patent
Xie

(10) Patent No.: US 8,233,315 B2
(45) Date of Patent: Jul. 31, 2012

(54) SPIN INJECTION DEVICE HAVING SEMICONDUCTOR-FERROMAGNETIC-SEMICONDUCTOR STRUCTURE AND SPIN TRANSISTOR

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/350,591

(22) Filed: Jan. 13, 2012

(65) Prior Publication Data

US 2012/0112189 A1 May 10, 2012

Related U.S. Application Data

(63) Continuation of application No. 12/307,741, filed as application No. PCT/US2007/072521 on Jun. 29, 2007, now Pat. No. 8,098,515.

(60) Provisional application No. 60/819,079, filed on Jul. 7, 2006.

(51) Int. Cl.
   *G11C 11/00* (2006.01)
(52) U.S. Cl. ........ 365/158; 257/421; 365/171; 365/173; 977/935
(58) Field of Classification Search ........................ None
   See application file for complete search history.

(56) References Cited

U.S. PATENT DOCUMENTS

| | | | |
|---|---|---|---|
| 5,298,452 A | 3/1994 | Meyerson | |
| 5,804,839 A | 9/1998 | Hanaoka et al. | |
| 5,966,620 A | 10/1999 | Sakaguchi et al. | |
| 6,114,056 A | 9/2000 | Inomata et al. | |
| 6,218,718 B1 | 4/2001 | Gregg et al. | |
| 6,482,729 B2 | 11/2002 | Ohno et al. | |
| 6,753,562 B1 | 6/2004 | Hsu et al. | |
| 6,873,545 B2 | 3/2005 | Johnson | |
| 2004/0084739 A1 | 5/2004 | Osipov et al. | |
| 2004/0178460 A1 | 9/2004 | Lee et al. | |
| 2004/0233587 A1 | 11/2004 | Osipov et al. | |
| 2006/0138502 A1 | 6/2006 | Sugahara et al. | |
| 2007/0082230 A1 | 4/2007 | Shi et al. | |

OTHER PUBLICATIONS

Monsma, D.J., et al., Perpendicular Hot Electron Spin-Valve Effect in a New Magnetic Field Sensor: The Spin-Valve Transistor, Physical Review Letters, vol. 74, No. 26, pp. 5260-5263, Jun. 26, 1995.
Wolf, S.A., et al., Spintronics: A Spin-Based Electronics Vision for the Future, www.sciencemag.org, Science, vol. 294, pp. 1488-1495, Nov. 16, 2001.
Jonker, B.T., et al., Electrical Spin Injection and Transport in Semiconductor Spintronic Devices, www.mrs.org/publications/bulletin, mrs bulletin, pp. 740-748, Oct. 2003.
Zutic, Fabian and Das Sarma: Spintronics: Fundamentals and applications, Rev. Mod. Phys. vol. 76, No. 2, pp. 380-384, Apr. 2004.

(Continued)

*Primary Examiner* — Alexander Sofocleous
(74) *Attorney, Agent, or Firm* — Vista IP Law Group LLP

(57) ABSTRACT

A spin injection device and spin transistor including a spin injection device. A spin injection device includes different semiconductor materials and a spin-polarizing ferromagnetic material there between. The semiconductor materials may have different crystalline structures, e.g., a first material can be polycrystalline or amorphous silicon, and a second material can be single crystalline silicon. Charge carriers are spin-polarized when the traverse the spin-polarizing ferromagnetic material and injected into the second semiconductor material. A Schottky barrier height between the first semiconductor and ferromagnetic materials is larger than a second Schottky barrier height between the ferromagnetic and second semiconductor materials. A spin injection device may be a source of a spin field effect transistor.

11 Claims, 5 Drawing Sheets

OTHER PUBLICATIONS

Wolf, S.A., et al., Spintronics: A Spin-Based Electronics Vision for the Future, http://www.sciencemag.org/cgi/content/abstrat/294/5546/1488, Apr. 25, 2007 (3 pages).

PCT International Search Report for PCT/US2007/072521 dated Mar. 27, 2008, Applicant: The Regents of the University of California, Form PCT/ISA/210 and 220 (4 pages).

PCT Written Opinion for PCT/US2007/072521 dated Mar. 27, 2008, Applicant: The Regents of the University of California, Form PCT/ISA/237 (6 pages).

PCT International Preliminary Report on Patentability (Chapter I of the Patent Cooperation Treaty) for PCT/US2007/072521, Applicant: The Regents of the University of California, Form PCT/IB/326 and 373, dated Jan. 22, 2009 (7 pages).

us 8,233,315 B2

SPIN INJECTION DEVICE HAVING SEMICONDUCTOR-FERROMAGNETIC-SEMICONDUCTOR STRUCTURE AND SPIN TRANSISTOR

REFERENCE TO RELATED APPLICATION

This Application is a continuation of U.S. application Ser. No. 12/307,741, issued as U.S. Pat. No 8,098,515, which is a U.S. National Stage filing under 35 U.S.C. §371 of International Application No. PCT/US2007/072521, filed Jun. 29, 2007, which claims priority of U.S. Provisional Patent Application No. 60/819,079 filed on Jul. 7, 2006. The contents of the aforementioned applications are incorporated by reference as if set forth fully herein. Priority to the aforementioned application is hereby expressly claimed in accordance with 35 U.S.C. §§119, 120, 365 and 371 and any other applicable statutes.

FIELD OF THE INVENTION

The field of the invention generally relates spintronics. More particularly, the field of the Invention relates to spin injection devices.

BACKGROUND

The semiconductor industry is increasingly being driven to decrease the size of semiconductor devices located on integrated circuits (ICs). For example, miniaturization is needed to accommodate the increasing density of ICs necessary for today's semiconductor products. Increased packing density and device size reduction has forced semiconductor device structures such as transistors to be located ever closer to one another.

As semiconductor device components become located closer together, the problem of so-called Joule heating becomes more pressing. In general, bulk flow of electrons within conventional semiconductor devices generates heat that must be dissipated. The problem of Joule heating is limiting the ability of semiconductor manufacturers to satisfy the demand for even smaller, more compact devices. Manufacturing smaller devices using known charge diffusion technologies results in increased Joule heating.

One potential solution to the Joule heating problem is to utilize the spin states of electrons rather than the charge of electrons. In addition to having a charge, electrons also have a well defined spin. "Spin" is a property of an electron that is generally related to the angular momentum of an electron about an axis within the electron. An electron has to spin states—spin up ($+\frac{1}{2}$) and spin down ($-\frac{1}{2}$). These discernable spin states can be flipped or toggled for purposes of identifying logic "0" and "1" values.

The amount of energy required to alter the electron spin may be less than the amount of energy needed for bulk charge movement (as is done in traditional semiconductor devices). For this reason, spin-based devices may offer a promising modality for very small semiconductor-based devices and provide the potential for faster logic devices, such as field-effect transistors (FETs), and may consume less power and generate less heat.

One significant challenge to the realization of spin-based FETs is the ability to electronically inject spin-polarized charge carriers (e.g., electrons) into a suitable substrate (e.g., single crystalline silicon) or semiconductor channel at room or ambient temperature. Spin-polarized refers to the state in which all or substantially all of the electrons are initialized to a given spin state (e.g., spin "up" or spin "down" state).

One known manner of initializing or polarizing electrons to have a certain spin state is based on passing the electrons or holes through ferromagnetic materials (which are metals) that have been magnetized then into semiconductor materials. More particularly, in certain known spin devices, magnetic forces spin polarize electrons as they pass through a ferromagnetic material. The spin-polarized electrons pass from a ferromagnetic material into a semiconductor-based material. Unfortunately, efficient spin injection using these types of structures may not be achievable due to the conductivity mismatch between the ferromagnetic material and the semiconductor-based material. More particularly, these effects cause electrons that were spin-polarized in the ferromagnetic material to randomize and assume various spin states when they are injected into the semiconductor material. This randomization negates or reduces the spin polarization that was achieved using ferromagnetic material, thereby making it difficult or impossible to achieve a common and detectable spin state.

Another known manner of initializing spin of electrons is to inject spin from a dilute magnetic semiconductor that serves to align spin in the presence of a magnetic field. Such devices may operate well at low temperatures but are not suitable at room temperature due to the magnetic semiconductor materials losing their spin-aligning capabilities at room temperatures.

Yet another known manner of initializing electrons to have a certain spin is based on quantum mechanical tunneling and use of an intermediate layer of silicon dioxide. Tunnel injection is, however, associated with high resistance, which is detrimental to FET operations.

A further known spin initialization method relies on optical polarization of electrons. This technique, however, has proved difficult, and it is generally believed to be incompatible or difficult to effectively implement with most microelectronic devices.

Other aspects of known spin initialization or injection devices and spin-based transistors are described in "Electrical Spin Injection and Transport in Semiconductor Spintronic Devices" by Jonker et al., "Spintronics: Fundamentals and applications," by Zutic et al., and "Perpendicular Hot Electron Spin-Valve Effect in a New Magnetic Field Sensor: The Spin-Valve Transistor" by D. J. Monsma et al., and U.S. Publication No. 2004/0178460 A1 by Lee et al., the contents of all of which are incorporated by reference as thought set forth in full.

Lee et al., for example, describe a spin injection device and a FET having a ferromagnetic-semiconductor-ferromagnetic structure. A spin-polarized carrier is injected into the channel region from the ferromagnetic source and detected from the ferromagnetic drain. A device having such a structural configuration, however, may suffer from spin randomization, as discussed above.

As a further example, Monsma et al. describe a spin-valve transistor having a particular bipolar junction transistor (BJT) configuration (emitter, base and collector). Monsma et al. describe a BJT structure having a layered Co/Cu base between an emitter and a collector that are formed of the same material (silicon). Monsma et al. describe preparing a transistor using direct bonding, which involves forming connections by spontaneous adhesion, rather than more widely used fabrication methods of thin film deposition.

The transistor and structure described by Monsma et al., however, may not be desirable for a number of reasons. The device structure described by Monsma et al. presents significant operational and manufacturing challenges due to direct bonding fabrication, which can be particularly difficult when dealing with thin or fine scale layers or materials. Moreover, the structure described by Monsma et al. is not based on initializing and detecting a particular spin polarization. For example, Monsma et al. explain that the thickness of individual Co or Cu layers is much smaller than the spin-flip diffusion length and, therefore, spin up and spin down electrodes carry current in parallel. Consequently, a common or dominant spin state cannot be readily identified.

A further disadvantage of the device structure described by Monsma et al. is that direct bonding may result in the introduction of defects into the Co/Cu material, resulting in scattering of electrons and disruption of electron transport. Moreover, the device structure described by Monsma et al. involves modulating magnetization of the Co/Cu material, which may present issues of slow switching times. Further difficulties may arise in forming contacts on the device due to the fact that the active device is situated in between two full thickness (~0.5 mm) Si wafers and access to the device may be difficult.

There thus is a need for spin injection devices, spin FETs that are capable of efficiently injecting spin-polarized electrons into a substrate, such as a single crystalline silicon material or substrate. Such devices, FETs and methods should be able to spin-polarize a substantial number of electrons to a particular spin state without spin alignment randomization associated with interfacial effects between ferromagnetic and semiconductor materials. Such spin injection devices should also have low resistance, which is an important figure of merit for the overall FET performance, particularly in terms of the power consumed by the device. In addition, such spin injection devices, FETs and methods should be capable of fabrication using accepted fabrication systems techniques and be amenable to incorporation into current and contemplated microelectronic devices. Further, such devices and FETs should be operable at room or ambient temperatures so that they can be used in various commercial devices and applications without environmental limitations. It would also be desirable to have spin FETs that can serve as an alternative to known silicon CMOS devices that are based on charge diffusion.

SUMMARY

In accordance with one embodiment, a spin injection device includes a first semiconductor material, a second semiconductor material that different than the first semiconductor material, and a spin-polarizing ferromagnetic material interposed between the first and second semiconductor materials. Charge carriers from the first semiconductor material are spin-polarized upon traversing the ferromagnetic material, and then injected into the second semiconductor material.

In another embodiment, a spin injection device includes a first semiconductor material, a second semiconductor material, and a spin-polarizing ferromagnetic material interposed between the first and second semiconductor materials. The first semiconductor material has an amorphous or polycrystalline structure, and the second semiconductor material has a single crystalline structure. The device is configured so that a first Schottky barrier formed by the first semiconductor material and the spin-polarizing ferromagnetic material is higher than a second Schottky barrier height formed by the spin-polarizing ferromagnetic material and the second semiconductor material, and charge carriers having random spin from the first semiconductor material traversing the spin-polarizing ferromagnetic material are spin-polarized, and spin-polarized charge carriers being injected from the spin-polarizing material into the second semiconductor material.

In an alternative embodiment, a spin transistor includes a source, a drain, a channel electrically connecting the source and drain, and a gate configured for controlling conduction of spin-polarized elements through the channel. The source is a spin injection device that includes a first semiconductor material, a second semiconductor material that different than the first semiconductor material, and a spin-polarizing ferromagnetic material interposed between the first and second semiconductor materials. Charge carriers from the first semiconductor material are spin-polarized upon traversing the ferromagnetic material, and then injected into the second semiconductor material.

In a further embodiment, a spin field-effect transistor includes a source, a drain, a channel electrically connecting the source and the drain and a gate configured for controlling conductivity of spin-polarized elements through the channel. The source is a spin injection device that includes a first semiconductor material, a second semiconductor material, and a spin-polarizing ferromagnetic material interposed between the first and second semiconductor materials. The first semiconductor material has an amorphous or polycrystalline structure, and the second semiconductor material has a single crystalline structure. The device is configured so that a height of a first Schottky barrier formed by the first semiconductor material and the spin-polarizing ferromagnetic material is larger than a height of a second Schottky barrier height formed by the spin-polarizing ferromagnetic material and the second semiconductor material, and charge carriers having random spin from the first semiconductor material traversing the spin-polarizing ferromagnetic material are spin-polarized, and spin-polarized charge carriers being injected from the spin-polarizing material into the second semiconductor material.

In one or more embodiments, the first and second semiconductor materials have different crystalline structures. The first semiconductor material, for example, may be amorphous or polycrystalline (e.g., amorphous or polycrystalline silicon), and the second semiconductor material, for example, may be single crystalline (e.g., single crystalline silicon).

Further, rather than a single element material, the semiconductor materials can be compounds including one or more elements. For example, the first semiconductor material may be polycrystalline or amorphous AlGaAs, GaAs or GaN, and the second semiconductor material may be single crystalline GaAs, AlGaAS, GaN, InSb or InP, provided that the Schottky barrier height between the first semiconductor and the ferromagnetic material is significantly higher than that between the ferromagnetic material and the second semiconductor.

The first semiconductor material may instead be a single crystalline material, and the second material may be an amorphous or polycrystalline material. For example, the first semiconductor material may be single crystalline GaAs, AlGaAS, GaN, InSb or InP, and the second semiconductor material, is polycrystalline or amorphous AlGaAs, GaAs or GaN, provided the Schottky barrier height between the first semiconductor and the ferromagnetic material is significantly higher than that between the ferromagnetic material and the second semiconductor.

Additionally, the first and second semiconductor materials may be different materials having the same crystalline structure provided the Schottky barrier height between the first semiconductor and the ferromagnetic material is significantly higher than that between the ferromagnetic material and the second semiconductor. For example, the first semiconductor material is single crystalline AlGaAs, and the second semiconductor material is single crystalline GaAs.

A thickness of the first semiconductor material may be greater than a thickness of the first semiconductor material required for a non-zero quasi-neutral region, and the ferromagnetic material may be a permalloy film (or other ferromagnetic materials such as Fe, Co, Ni, etc.) having a thickness of about 1-100 nm, and a spin diffusion length ($L_{SD}$) that is significantly shorter than an electronic energy relaxation mean free path ($L_E$). For example, the ferromagnetic material may have a thickness of at least two times a spin diffusion length ($L_{SD}$) of the spin-polarizing ferromagnetic material.

In one or more embodiments, a spin injection device may be a source of a field effect transistor, such as a spin metal-oxide-semiconductor field-effect transistor. A material of a channel of a field effect transistor may be the same material as the second semiconductor material into which spin-polarized charge carriers are injected. Given the structure of embodiments, they can operate at ambient temperature, and spin-polarization can be achieved without having to modulate magnetization of a ferromagnetic material since the ferromagnetic material is subject to a substantially constant magnetization level, e.g., saturation.

Further features and advantages will become apparent upon review of the following drawings and description.

DETAILED DESCRIPTION OF ILLUSTRATED EMBODIMENTS

Embodiments provide a new approach for efficient spin injection and spin FETs that utilize a hybrid semiconductor-ferromagnetic-semiconductor spin injection structure as opposed to known ferromagnetic-semiconductor-ferromagnetic structures and BJT spin valve transistors. Embodiments may operate at room temperature and may be made using accepted photolithography methods rather than direct bonding. Embodiments are advantageously structured to inject spin-polarized charge carriers into a substrate or semiconductor material, for example, single crystalline silicon, thus allowing introduction and manipulation of spin-polarized charge carriers by other microelectronic devices, while eliminating or mitigating Joule heating issues associated with known devices based on charge diffusion.

Figure 1:
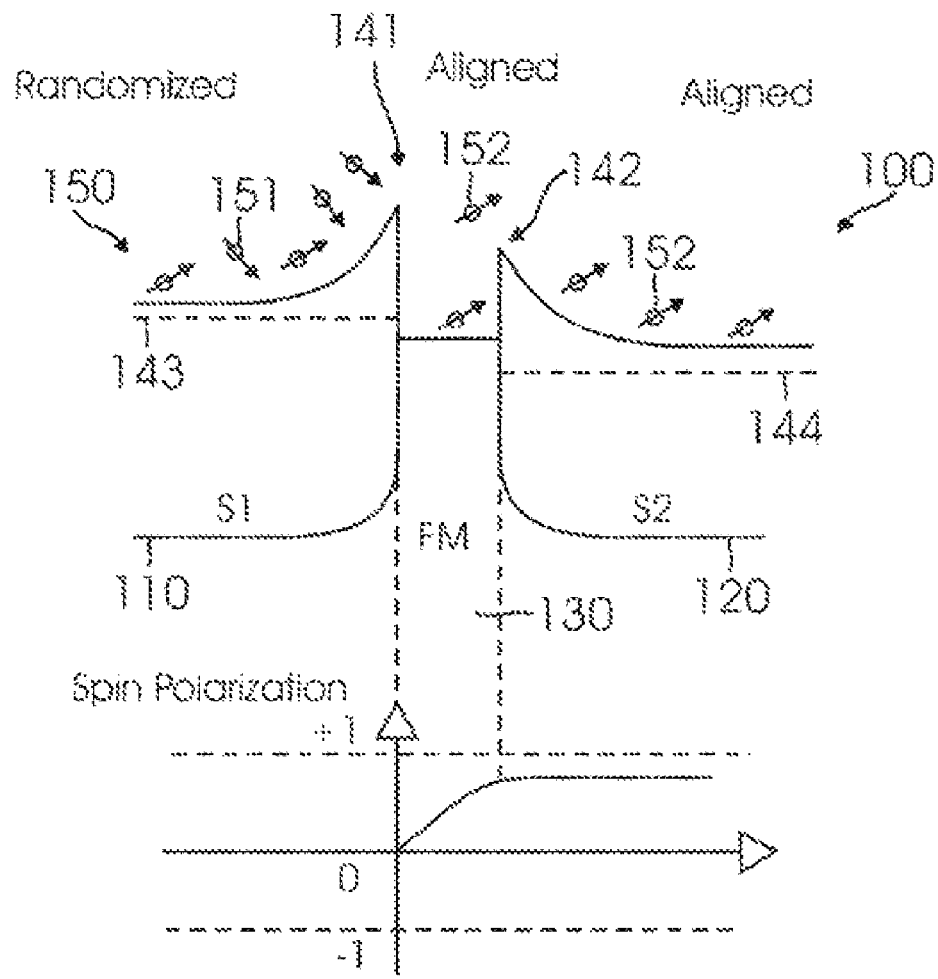
FIG. 1 is an energy band/spin polarization diagram of a spin injection device constructed in accordance with one embodiment.
Figure 2:
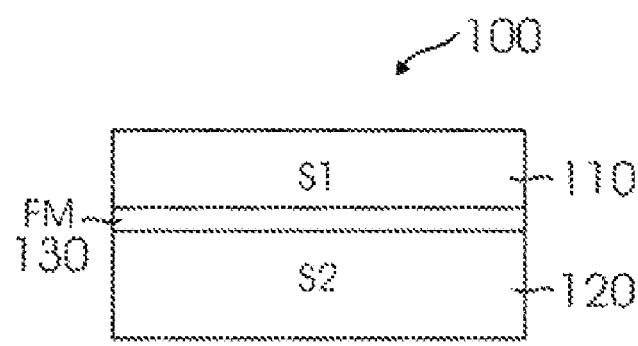
FIG. 2 is a cross-sectional view generally illustrating components of a spin injection device constructed in accordance with one embodiment.
Figure 3:
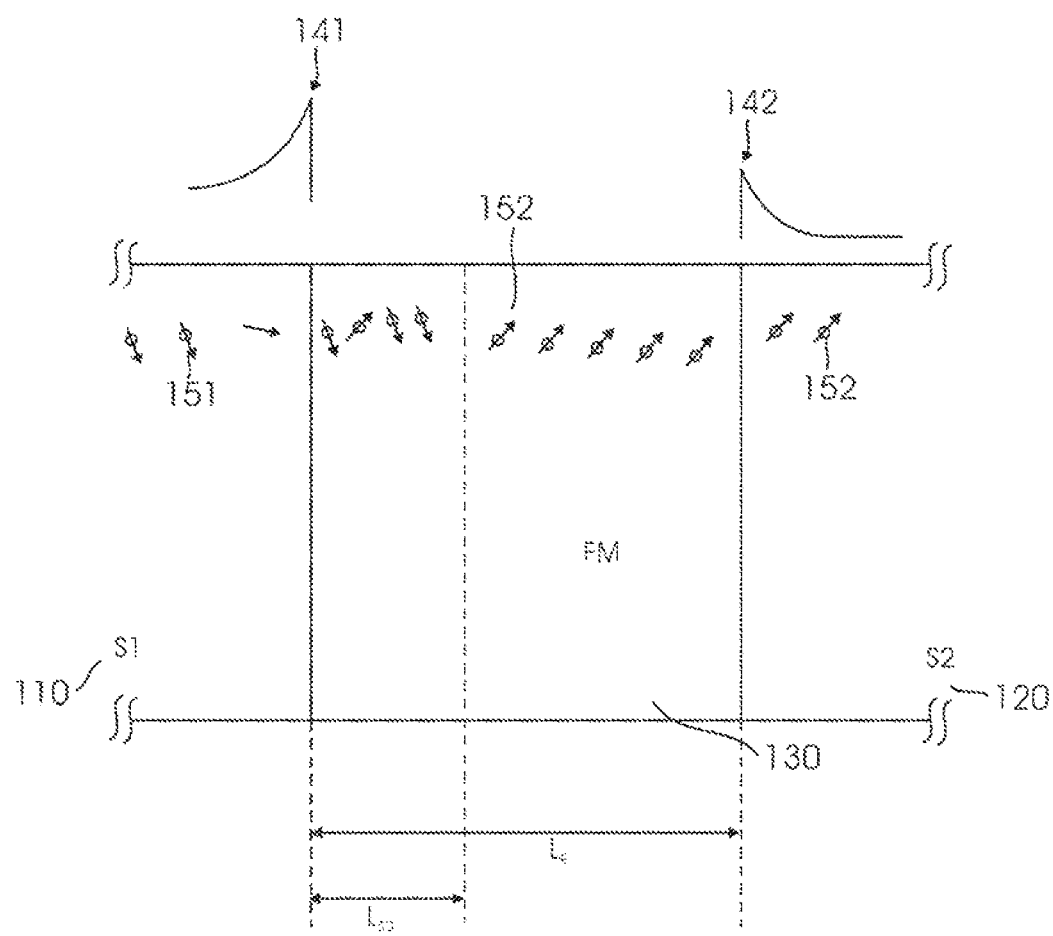
FIG. 3 illustrates spin polarization of charge carriers as they traverse an intermediate ferromagnetic material of a spin injection device constructed in accordance with one embodiment.

Referring to FIGS. 1-3, a spin injection or initialization device 100 constructed in accordance with one embodiment includes a first semiconductor material 110 (S1), a second semiconductor material 120 (S2) that is different than the first semiconductor material 120, and a spin-polarizing ferromagnetic material 130 (FM). The ferromagnetic material 130 is interposed between the first and second semiconductor materials 110, 120.

As shown in FIG. 1, embodiments utilize a structural configuration including a first Schottky barrier or junction 141 (generally referred to as "first Schottky barrier 141) defined or formed by the contact between first semiconductor material 110 and the ferromagnetic material 130 and a second Schottky barrier or junction 142 (generally referred to as "second Schottky barrier 142") defined or formed by the contact between the ferromagnetic material 130 and the second semiconductor material 120. The first Schottky barrier 141 has an associated first Fermi energy level 143 (represented as dotted line), which is higher than a second Fermi energy level 144 (represented as dotted line) associated with the second Schottky barrier 142. With embodiments, the first Schottky barrier 141 is higher than the second Schottky barrier 142 when, for example, the ferromagnetic material 130 is under sufficient magnetization. According to one embodiment, the ferromagnetic material 130 is subject to a substantially constant level of magnetization, e.g., saturation, or the maximum induced magnetic moment or magnetization that can be obtained in a given magnetic field.

With this structural configuration, charge carriers 150 (e.g., electrons or holes) (generally referred to as electrons for ease of explanation) from the first semiconductor material 110 may have random spin 151, and are spin-polarized 152 as they traverse the ferromagnetic material 130. Spin-polarized electrons 152 are then injected from the ferromagnetic material 130 into the second semiconductor material 120 assuming they have sufficient kinetic energy. The second semiconductor material 120 may serve as a substrate and source of spin-polarized electrons 152 for other micro-electronic components.

As indicated by the "S1" and "S2" identifiers, the first and second semiconductor materials 110, 120 are different materials. In one embodiment, the first and second semiconductor materials 110, 120 are different and define a structure in which the first Schottky barrier 141 is higher than the second Schottky barrier 142. The material may also be different in that they have different energy band gaps, i.e., the first semiconductor material 110 (e.g., amorphous or polycrystalline silicon) has an energy band gap that is wider than an energy band gap of the second semiconductor material 120 (e.g., single crystalline silicon).

According to other embodiments, the semiconductor materials 110, 120 are different in that they have different compositions, compounds or elements, different chemical properties and/or crystalline properties. The first and second semiconductor materials 110, 120 may, for example, have different crystalline structures. In one embodiment, the first semiconductor material 110 is amorphous or has a polycrystalline structure, and the second semiconductor material 120 has a single crystalline structure. With this configuration, electrons that may initially have a random spin or that are not polarized 151 are spin-polarized 152 by the ferromagnetic material 130, and spin-polarized electrons 152 are advantageously injected into the second or single crystalline semiconductor material 120. Substantially all of the spin-polarized charge carriers 152 injected into the second semiconductor material 120 material may maintain the common spin alignment.

Figure 4:
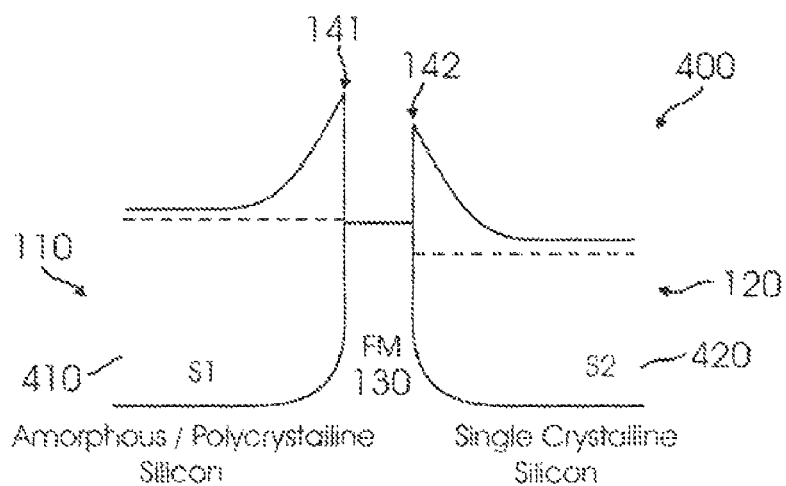
FIG. 4 is an energy band diagram of a spin injection device constructed in accordance with one embodiment that includes a ferromagnetic material interposed between different crystalline forms of silicon.
Figure 5:
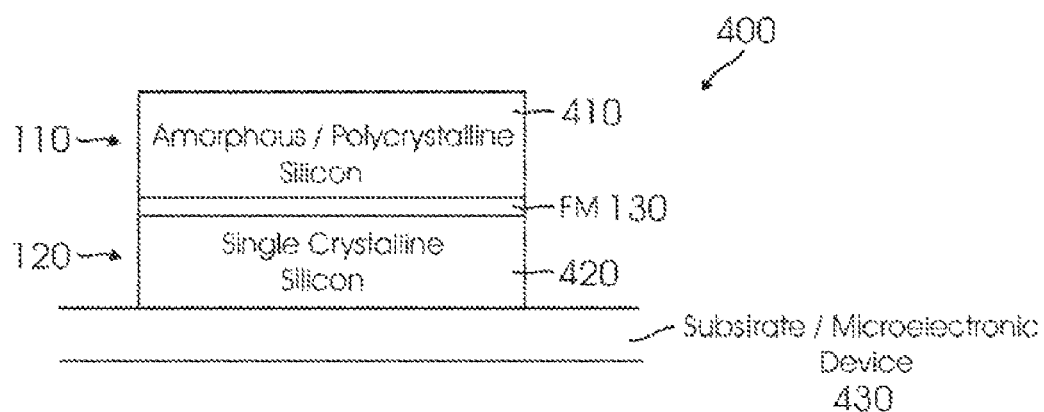
FIG. 5 is a cross-sectional view of a spin injection device constructed as shown in FIG. 4.

Referring to FIGS. 4 and 5, a spin injection device 400 constructed according to one embodiment includes first and second semiconductor materials 110, 120 that are different crystalline forms of silicon. In one embodiment, the first semiconductor material 110 is amorphous or polycrystalline silicon 410, and the second semiconductor material 120 is single crystalline silicon 420, e.g., formed from a single crystalline n+ silicon wafer or substrate. With this configuration, electrons 150 that may initially have a random spin or that are not polarized 151, traverse through the ferromagnetic material 130, and spin polarized electrons 152 are injected into the single crystalline silicon 420.

A spin injection device 400 that includes silicon having different crystalline structures is beneficial because amorphous silicon 410 has a wider apparent energy band gap than single crystalline silicon 420, and single crystalline silicon material 420 can be used for interfacing with microelectronic devices and substrates (generally illustrated as 430), which may also be silicon. This integration can be achieved without the need for direct bonding (as is utilized with the configuration described by Monsma et al.).

In one embodiment, the first semiconductor material 110 is thicker than a thickness of the first semiconductor material 110 that would be required for a non-zero quasi-neutral region. For example, the first semiconductor material 110 in the form of amorphous or polycrystalline silicon 410 can have a thickness of about 1-10,000 nm, and the second semiconductor material 120 in the form of single crystalline silicon 420 can have a thickness of about 10 nm to several mm. With this structure, the thickness of the ferromagnetic material 130 can be about 1-100 nm. Of course, thicknesses of materials for use with embodiments may vary on the type of materials utilized.

Although FIGS. 4 and 5 illustrate an embodiment having amorphous silicon 410 and single crystalline silicon 420, alternative embodiments can be implemented with other different semiconductor materials 110, 120. For example, in other embodiments, the first semiconductor material 110 may be one of polycrystalline or amorphous AlGaAs, GaAs or GaN, and the second semiconductor material 120 may be one of single crystalline GaAs, AlGaAS, GaN, InSb or InP. The particular combination of compounds that is selected should result in a spin injection device structure in which the Schottky barrier height 141 between the first semiconductor material 110 and the ferromagnetic material 130 is significantly higher than that between the ferromagnetic material 130 and the second semiconductor material 120.

In other embodiments, the first semiconductor material 110 may instead be a single crystalline material, and the second material 120 may be an amorphous or polycrystalline material. For example, the first semiconductor material 110 may be one of single crystalline GaAs, AlGaAS, GaN, InSb or InP, and the second semiconductor material 120 may be one of polycrystalline or amorphous AlGaAs, GaAs or GaN, provided the Schottky barrier 141 height between the first semiconductor 110 and the ferromagnetic material 130 is significantly higher than the Schottky barrier 142 height between the ferromagnetic material 130 and the second semiconductor 120.

In other embodiments, the first and second semiconductor materials 110, 120 are different materials or compounds having the same crystalline structure, provided that the Schottky barrier 141 height between the first semiconductor 110 and the ferromagnetic material 130 is significantly higher than the Schottky barrier 142 height between the ferromagnetic material 130 and the second semiconductor 120. For example, the first semiconductor material may be single crystalline AlGaAs, and the second semiconductor material 120 may be single crystalline GaAs. In this example, single crystalline AlGaAs has an energy band gap that is wider than that of single crystalline GaAs.

It should be understood, however, that the types of materials and combinations thereof discussed above are provided as examples of how embodiments can be implemented. Embodiments can be implemented using various combinations of amorphous/polycrystalline semiconductor materials, single crystalline materials, and various compounds). Exemplary criteria for the selection of suitable first and second semiconductor materials 110, 120 may include the Schottky barrier height 141 being higher than the Schottky barrier height 142, the materials 110, 120 having comparable electron concentrations, and the k-value of the conduction band minima between the semiconductor materials 110, 120 matching or substantially matching. The reciprocal space location of the electrons in the first semiconductor material 110 should be nearly identical to that in the second semiconductor material 120 so that the transport of electrons from the first semiconductor material 110 to the second semiconductor material 120 does not require the involvement of phonons.

The ferromagnetic material 130 is preferably in the form of a thin film and can be, or include, for example, iron, cobalt, nickel and combinations thereof. The ferromagnetic material 130 may include cobalt, but the ferromagnetic material 130 should have a sufficiently short spin diffusion length. According to one embodiment, the ferromagnetic material 130 is a permalloy film composed of about 80% nickel and about 20% iron and has an estimated spin diffusion length of about 6 nm), whereas the spin diffusion length of iron is about 2 nm, and the spin diffusion length of Cobalt is about 44 nm. Considerations for selecting the thickness of the ferromagnetic material 130 so that spin-polarized electrons 152 maintain sufficient kinetic energy are described in further detail below.

The ferromagnetic material 130 preferably has a sufficiently short spin diffusion length ($L_{SD}$) (distance an electron diffuses through the ferromagnetic material 130 before being spin polarized) and a thickness that allows electrons 150 that are initially in a random spin state 151 to traverse through the ferromagnetic material 130 and be spin-polarized 152 while maintaining most or substantially all of their kinetic energy. In this manner, the spin-polarized electrons 152 have sufficient kinetic energy to overcome the second Schottky barrier 142 and be injected into the second semiconductor material 120.

The thickness of the ferromagnetic material or film 130 may depend on, for example, the type of ferromagnetic material 130, the spin diffusion length of the ferromagnetic material 130, the kinetic energy of the spin-polarized electrons 152 upon entering the ferromagnetic material 130 (which may depend on first Schottky barrier 141 and the type of first semiconductor material 110), and the height of the second Schottky barrier 142 (which may depend on the type of the second semiconductor material 120). In one embodiment, the ferromagnetic material 130 is a permalloy having a thickness on the order of nanometers, e.g., about 1-100 nm. Considerations for selecting the thickness of the ferromagnetic material 130 so that spin-polarized electrons 152 maintain sufficient kinetic energy are described in further detail below.

Referring again to FIGS. 1-3, electrons 150 in the first semiconductor material 110 have random spin 151, which can be spin up or spin down. Thus, the resulting spin polarization has a value of "0" on a scale from 0 to 1 as shown in polarization graph of FIG. 1. Electrons having a random spin 151 are provided from the first semiconductor material 110 (e.g., amorphous or polycrystalline silicon) and traverse through the ferromagnetic material 130 (e.g., a permalloy), over the forward biased first Schottky barrier 141. With the ferromagnetic material 130 being, e.g., under saturation magnetization, random spin electrons 151 are spin polarized 152 as they are aligned with the magnetization of the ferromagnetic material 130. Electrons that were initially spin down are re-aligned to be spin up, and electrons that were initially spin up remain spin up (in the example in which the ferromagnetic material 130 causes spin up polarization). FIGS. 1 and 3 illustrate an example in which electrons are aligned to a spin up state as they traverse through ferromagnetic material 130, however, it should be understood that embodiments can also be implemented using a spin down alignment with a different magnetization.

Electrons are spin polarized 152 while traversing through the ferromagnetic material 130, and their kinetic energy remains essentially the same assuming that the electronic energy relaxation mean free path (Le) (average distance an electron loses about 33% of its kinetic energy) is longer than $L_{SD}$ (spin diffusion length). In this manner, a significant portion of electrons 151 become spin-polarized while traversing the ferromagnetic material 130, and substantially all of the electrons, e.g. almost 100% of the electrons, can be spin-polarized 152 if the thickness of the ferromagnetic material 130 is more than about two times the spin diffusion length.

Since the kinetic energy of the spin-polarized electrons 152 remains substantially the same, most of the spin-polarized electrons 152 have sufficient kinetic energy to scale the second Schottky barrier 142 and, therefore, are injected into the second semiconductor material 120 (e.g. single crystalline silicon). Specifically, the kinetic energy of a spin-polarized electron 152 upon exiting the ferromagnetic material 130 must be greater than the height of the second Schottky barrier 142. In other words, the loss of electron kinetic energy due to an electron traversing the ferromagnetic material 130 must less than the difference between the height of the first Schottky barrier 141 and the height of the second Schottky barrier 142 in order for the electron to be injected into the second semiconductor material 120.

Spin-polarized electrons 152 (and any electrons that may not have been spin-polarized) that do not have sufficient kinetic energy to scale the second Schottky barrier 142 are not injected into the second semiconductor material 120. Instead, these electrons remain within the ferromagnetic material 130. It is estimated that embodiments can be implemented so that about 50% to about 99% of the spin-polarized electrons 152 will have sufficient kinetic energy and are injected from the ferromagnetic material 130 into the second semiconductor material 120.

Figure 6:
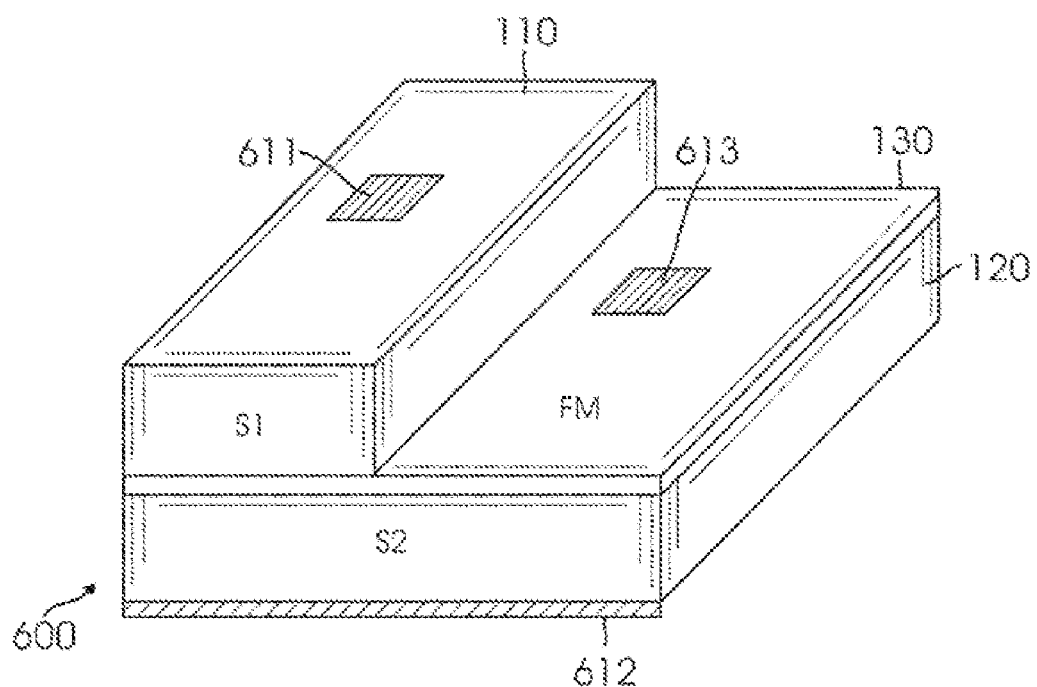
FIG. 6 is a perspective cross-sectional view of a spin injection device constructed as shown in FIGS. 4 and 5 and having electrical contacts.

FIG. 6 generally illustrates a perspective cross-sectional view of a spin injection device 600 constructed in accordance with one embodiment. The spin injection device 600 includes a ferromagnetic material 130 interposed between different semiconductor materials 110 and 120, a metallic contact 611 (e.g. aluminum) on the first semiconductor material 110 to provide a source of charge carriers (electrons or holes), a contact 612 (e.g. aluminum) on the second semiconductor material 120, and a contact 613 (e.g., aluminum) on the ferromagnetic material 130.

Figure 7:
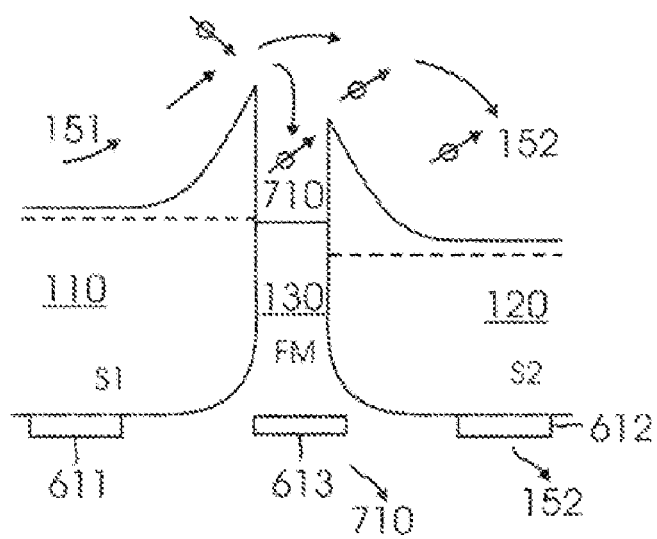
FIG. 7 is an energy band diagram of one embodiment of a spin injection device illustrating spin-polarized charge carriers injected into a second semiconductor material and other spin-polarized charge carriers that remain in the ferromagnetic material depending on electron energy levels.

With further reference to FIG. 7, spin-polarized electrons 710 within the ferromagnetic material 130 that have lost sufficient kinetic energy and cannot overcome the second Schottky barrier 142 remain in the ferromagnetic material 130 and can be siphoned or drawn out of the ferromagnetic material 130 through contact 613 (shown with reference to energy band structure illustrated in FIG. 1). Spin-polarized electrons 152 that have sufficient kinetic energy and are injected into the second semiconductor material 120 can be conducted through contact 612.

Figure 8:
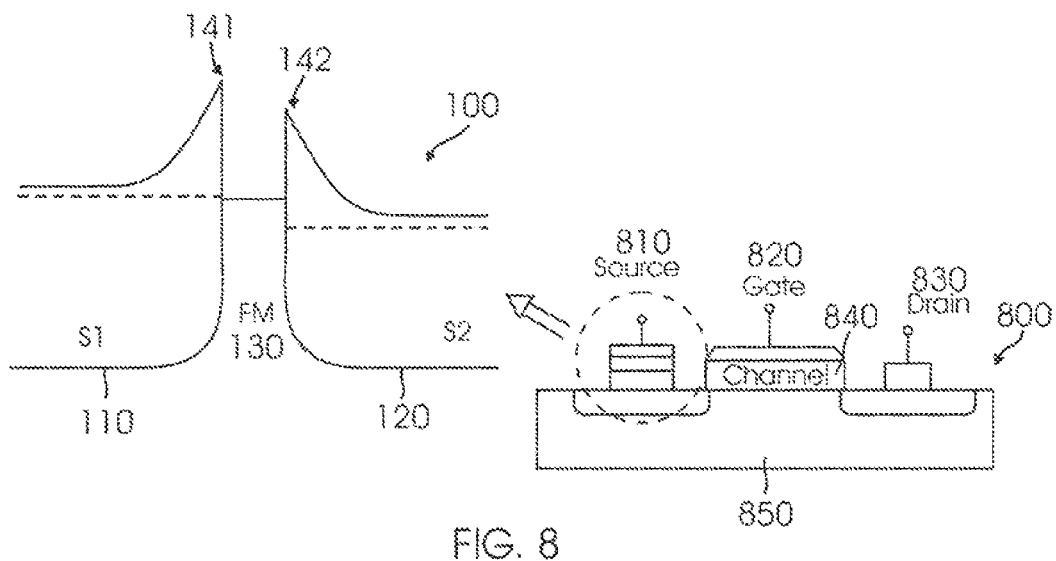
FIG. 8 illustrates a field-effect transistor constructed in accordance with one embodiment including a source in the form of a spin injection device structured as shown in FIG. 1.
Figure 9:
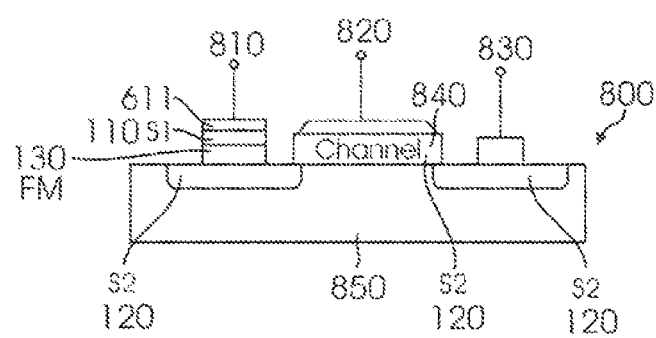
FIG. 9 illustrates the field-effect transistor shown in FIG. 8 in further detail.

WOW Referring to FIGS. 8 and 9, according to another embodiment, a spin injection or initialization device 100 can be a component of a FET 800, such as a spin metal-oxide-semiconductor field-effect transistor (spin MOSFET). As generally illustrated in FIG. 8, a FET typically includes a source 810, a gate 820, a drain 830, a channel or active region 840, and an underlying substrate or body 850. The channel 840 is disposed under the gate 820 and electrically connects the source 810 and the drain 830. The gate 820 controls conduction through the channel 840. The basic components and operation of FETs (based solely on charge diffusion) are well known and, therefore, are not described in further detail.

In one embodiment, a FET 800 includes the spin injection or initialization device 100 as the source 810. As shown in FIGS. 8 and 9, the channel 840 may include or be composed of the same second semiconductor material 120. Thus, FIGS. 8 and 9 illustrate that embodiments can be integrated within FET devices to provide spin FETs. These devices may serve as a substitute for known FET devices that operate based on charge diffusion and may mitigate or eliminate issues of Joule heating associated with charge diffusion devices.

Embodiments can be fabricated using known and widely used photolithography fabrication equipment and processes and on a commercial scale. For example, beginning with a single crystalline silicon wafer or substrate 420 (the second semiconductor material 120), the ferromagnetic material 130 can be deposited on the single crystalline wafer 420, and then amorphous or polycrystalline silicon 410 (the first semiconductor material 110) may be deposited on the ferromagnetic material 130. A metal layer may then be deposited on the amorphous or polycrystalline silicon 410 to provide an electrical contact, e.g. contact 611 (as shown in FIG. 6).

In this manner, embodiments advantageously provide efficient spin injection devices that can be fabricated using known deposition systems and techniques. Further, since the substrate or second semiconductor material 120 may be single crystalline silicon 420, embodiments of spin-injection devices may be integrated with other microelectronic devices for use in various applications. Additionally, by use of such known fabrication methods, embodiments can be manufactured while maintaining purity of the ferromagnetic material 130 or electron transport region, thus reducing or minimizing electron scattering and maintaining acceptable $L_{ED}$ and $L_E$ values.

For example, one method of fabricating embodiments having a first semiconductor 110—ferromagnetic 130—second semiconductor 120 structure utilizes known photolithography techniques, programs and systems, which are mentioned or summarized below but not described in detail since they are known. Beginning with a n+ single crystalline silicon wafer or substrate 420 (the second semiconductor material 120), a surface of the wafer 420 may be cleaned and prepared, e.g., using acetone, alcohol, dilute hydrogen fluoride (HF), de-ionized water, and $N_2$ blow drying. The single crystalline wafer 420 may then be loaded into a deposition chamber. A layer of ferromagnetic material 130 (e.g., nickel having a thickness of about 5 nm), may then deposited on the single crystalline silicon wafer 420, followed by deposition of a layer of amorphous n-type silicon 410 having a thickness of about 100 nm. A metallic layer (e.g., aluminum) may then be deposited on the amorphous n-type silicon 410 for use as an electrical contact 611 (as generally illustrated in FIG. 6). These depositions may be performed, e.g., sequentially in an e-beam evaporator. A layer of aluminum may also be deposited on the unpolished side of the single crystalline silicon wafer 420 for use as an electrical contact 612 (e.g., as generally illustrated in FIG. 6).

Photolithography may then be performed to define the area of a spin injection device, e.g., using Mask 2 in L-edit design and suitable photolithographic parameters (e.g., type of photoresist, spin speed, spin time, exposure time, developer mixtures and developing time. The exposed aluminum layer on the polished side may be etched, and KOH etching may be used to remove exposed amorphous silicon 410 and to expose a layer of the nickel ferromagnetic layer 130. Lithography may then be performed to define an aluminum-nickel contact 611 utilizing Mask 3 in L-edit (or other photo mask layout software tools) design. Aluminum having a thickness of about 100 nm may be deposited for use as a contact 613 (as generally illustrated in FIG. 6) using the e-beam evaporator. The lift-off process may be completed using acetone and an ultrasonic machine, and lithography may be performed to define mesa etch using Mask 1 in L-edit design. An aluminum etch may then used to remove exposed aluminum, and RIE etching may be performed for the mesa etch to remove single crystalline silicon 420. For example, embodiments can involve removing about 100 nm of amorphous silicon 410, about 5 nm of nickel ferromagnetic material 130, and some amount of the single crystalline silicon substrate 420. It should be understood, however, that spin injection device and spin FET embodiments can be fabricated using other methods and various photolithographic parameters.

While embodiments of the present invention have been shown and described, various modifications may be made without departing from the scope of embodiments of the present invention. For example, although embodiments are described with reference to electrons, holes can also be manipulated with embodiments in a similar manner. Additionally, although embodiments are described with reference to amorphous/polycrystalline silicon and single crystalline silicon, embodiments can be implemented with other types of semiconductor materials that have different material or crystalline properties. Moreover, spin injection device and spin FET embodiments may have application in various devices including memory (e.g., nonvolatile memory, "magnetic RAM"), reconfigurable logic architectures, sensors or detectors (e.g., magnetic field sensors, position sensors, speed sensors, hard disk heads), and field programmable gate arrays. Embodiments of the invention, therefore, should not be limited, except to the following claims, and their equivalents.

What is claimed is:

1. A spin field-effect transistor, comprising:
a source including a first semiconductor material having an amorphous or polycrystalline structure, a second semiconductor material having a single crystalline structure, and a spin-polarizing ferromagnetic material interposed between the first and second semiconductor materials, a first Schottky barrier formed by the first semiconductor material and the spin-polarizing ferromagnetic material being higher than a second Schottky barrier height formed by the spin-polarizing ferromagnetic material and the second semiconductor material, charge carriers having random spin from the first semiconductor material traversing the spin-polarizing ferromagnetic material, and spin-polarized charge carriers being injected from the spin-polarizing material into the second semiconductor material;
a drain;
a channel electrically connecting the source and the drain; and
a gate configured for controlling conductivity of spin-polarized elements through the channel.

2. The spin transistor of claim 1, wherein the first semiconductor material is amorphous or polycrystalline silicon, and the second semiconductor material is single crystalline silicon.

3. The spin transistor of claim 1, wherein the first semiconductor material is polycrystalline or amorphous AlGaAs, GaAs or GaN.

4. The spin transistor of claim 1, wherein the second semiconductor material is single crystalline GaAs, AlGaAS, GaN, InSb or InP.

5. The spin transistor of claim 1, wherein the first Schottky barrier is forward biased, and the second Schottky barrier is reverse biased.

6. The spin transistor of claim 1 being operable at ambient temperature.

7. The spin transistor of claim 1, wherein the spin-polarizing ferromagnetic material is subject to a substantially constant level of magnetization.

8. The spin injection device of claim 1, wherein an energy band gap of the first semiconductor material is wider than an energy band gap of the second semiconductor material.

9. The spin injection device of claim 1, wherein the spin-polarizing ferromagnetic material has a spin diffusion length ($L_{SD}$) that is significantly shorter than an electronic energy relaxation mean free path ($L_E$).

10. The spin transistor of claim 1, wherein the spin-polarizing ferromagnetic material is a permalloy film having a thickness of about 1-100 nm.

11. The spin transistor of claim 1, wherein the spin-polarizing ferromagnetic material has a thickness of at least two times a spin diffusion length ($L_{SD}$) of the spin-polarizing ferromagnetic material.

* * * * *